United States Patent
Kang et al.

(10) Patent No.: US 7,477,569 B2
(45) Date of Patent: Jan. 13, 2009

(54) SEMICONDUCTOR MEMORY DEVICE CAPABLE OF PERFORMING PAGE MODE OPERATION

(75) Inventors: Eun-Suk Kang, Suwon-si (KR); So-Hoe Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 234 days.

(21) Appl. No.: 11/316,897

(22) Filed: Dec. 27, 2005

(65) Prior Publication Data

US 2006/0164910 A1 Jul. 27, 2006

(30) Foreign Application Priority Data

Jan. 25, 2005 (KR) .............. 10-2005-0006838

(51) Int. Cl.
*G11C 8/18* (2006.01)
(52) U.S. Cl. .............. 365/233.5; 365/233.11
(58) Field of Classification Search .......... 365/230.01, 365/233.1, 233.5, 185.12, 238.5
See application file for complete search history.

(56) References Cited

U.S. PATENT DOCUMENTS

| | | | |
|---|---|---|---|
| 5,694,370 A * | 12/1997 | Yoon | 365/233.5 |
| 7,184,362 B2 * | 2/2007 | Lee | 365/235 |
| 7,227,811 B2 * | 6/2007 | Cho | 365/233.5 |
| 2002/0012278 A1 | 1/2002 | Akaogi et al. | |
| 2004/0170081 A1 * | 9/2004 | Takahashi et al. | 365/233.5 |

FOREIGN PATENT DOCUMENTS

| | | |
|---|---|---|
| JP | 11-265569 | 9/1999 |
| KR | 1019950004854 B1 | 5/1995 |
| KR | 1020030014386 A | 2/2003 |

* cited by examiner

*Primary Examiner*—Anh Phung
*Assistant Examiner*—Douglas King
(74) *Attorney, Agent, or Firm*—Volentine & Whitt, PLLC

(57) ABSTRACT

A semiconductor memory device adapted to perform a page mode operation comprises a first address transition detector adapted generate a first clock signal upon detecting a transition of a start address, a second address transition detector adapted to generate a second clock signal upon detecting transition of a lower bit of the start address and after the first clock signal is generated, and an address controller adapted to sequentially increment the start address in response to a transition of the second clock signal. The address controller sequentially accesses memory cells selected by the start address and the incremented start address in response to a transition of the second clock signal.

14 Claims, 4 Drawing Sheets

US 7,477,569 B2

SEMICONDUCTOR MEMORY DEVICE CAPABLE OF PERFORMING PAGE MODE OPERATION

BACKGROUND OF THE INVENTION

1. Field of the Invention

Embodiments of the present invention relate generally to a semiconductor memory device. More particularly, embodiments of the invention relate to a semiconductor memory device capable of performing a page mode operation.

A claim of priority is made to Korean Patent Application No. 2005-06838, filed on Jan. 25, 2005, the disclosure of which is hereby incorporated by reference in its entirety.

2. Description of Related Art

Semiconductor memory devices are commonly used to provide temporary and long term data storage in modern electronic equipment. Semiconductor memory devices can be roughly classified into two categories: volatile memory devices and non-volatile memory devices. In a volatile memory device, data disappears once the device loses power. Volatile memory devices include, for example, dynamic random access memory (DRAM), static random access memory (SRAM). In a non-volatile memory device, on the other hand, stored data is retained even when the power is cut off. Non-volatile memory devices include, for example, programmable read only memory (PROM), erasable programmable read only memory (EPROM), electrically erasable programmable read only memory (EEPROM), and flash memory.

Flash memories are currently among the more popular forms of non-volatile memory. Among other things, flash memories are popular because of their non-volatility, large storage capacity, durability, fast program/read times, and cost.

Flash memory devices can be broadly classified into two categories depending on the type of logic gate used in each memory cell. The two categories are NAND flash memories and NOR flash memories. Typically, NAND flash memories are used for mass data storage because they are more highly integrated, cheaper, and faster to program and erase, but slower to read than NOR flash memories. NOR flash memories, on the other hand, are generally used to store data that needs to be read faster, but requires relatively few updates, such as program code.

One common technique used to improve the average access time and power efficiency for semiconductor memories is a "page mode operation". Page mode operations are operations of a semiconductor memory device performed while the device is in a "page mode". For example, the semiconductor memory device can be programmed or read while in the page mode. Briefly, in a page mode operation, a page of data is read into a buffer and then subsequent operations (e.g., reading, programming) are performed to locations within the page. FIG. 1 shows a waveform timing diagram of a conventional page mode read operation. The timing diagram in FIG. 1 is disclosed in Korean Patent Application No. 1992-18440.

Referring to FIG. 1, a start address Ax[15:0] is input to a semiconductor memory device from an outside source. In a page mode operation, start address Ax[15:0] is divided into a normal address Ax[15:3] and a page address Ax[2:0].

During the page mode operation, normal address Ax[15:3] stays the same, but page address Ax[2:0] can change to output different data from within the same page. FIG. 1 shows a page mode operation where a page length is eight words and page address Ax[2:0] has three bits. The semiconductor memory device receives an output enable signal nOE to control the output of data from the semiconductor memory device in the page mode read operation.

A conventional semiconductor memory device capable of performing a page mode operation typically comprises a normal address transition detector (NATD) for detecting changes (or transitions) in the normal address and a page address transition detector (PATD) for detecting changes (or transitions) in the page address. Each of the address transition detectors generates a pulse when a page or normal address changes. The conventional semiconductor memory device typically generates a clock signal for output data using pulses output by an address transition detector.

Unfortunately, the PATD in the conventional semiconductor memory device detects all variations in the page address. For example, when any of the three bits in a page address Ax[2:0] varies, the variation is detected. Monitoring all three bits, however, lowers the performance of the semiconductor memory device.

SUMMARY OF THE INVENTION

According to one embodiment of the invention, a semiconductor memory device adapted to perform a page mode operation is provided. The device comprises a first address transition detector adapted generate a first clock signal upon detecting a transition of a start address, a second address transition detector adapted to generate a second clock signal upon detecting transition of a lower bit of the start address and after generating the first clock signal, and an address controller adapted to sequentially increment the start address in response to a transition of the second clock signal. The address controller sequentially accesses memory cells selected by the start address and the incremented start address in response to a transition of the second clock signal.

According to another embodiment of the invention, another semiconductor memory device adapted to perform a page mode operation is provided. The device comprises a first address transition detector adapted to generate a first clock signal upon detecting a transition of a start address, a second address transition detector adapted to generate a second clock signal after detecting a transition of a lower bit of the start address and after the first clock signal is generated, an internal clock generator adapted to internally generate a third clock signal before the second clock signal is generated, and an address controller adapted to sequentially increment the start address in response to respective transitions of the second and third clock signals. The address controller sequentially accesses memory cells selected by the start address and the incremented start address in response to respective transitions of the second and third clock signals.

According to still another embodiment of the invention, a method of performing a page mode operation in a semiconductor memory device is provided. The method comprises generating a first clock signal upon detecting a transition of a start address, generating a second clock signal upon detecting a transition of a lower bit of the start address and after the first clock signal is generated, and incrementing the start address in synchronization with a transition of the second clock signal to access memory cells selected according to an initial value of the start address and an incremented value of the start address.

BRIEF DESCRIPTION OF THE DRAWINGS

The invention is described below in relation to several embodiments illustrated in the accompanying drawings.

Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
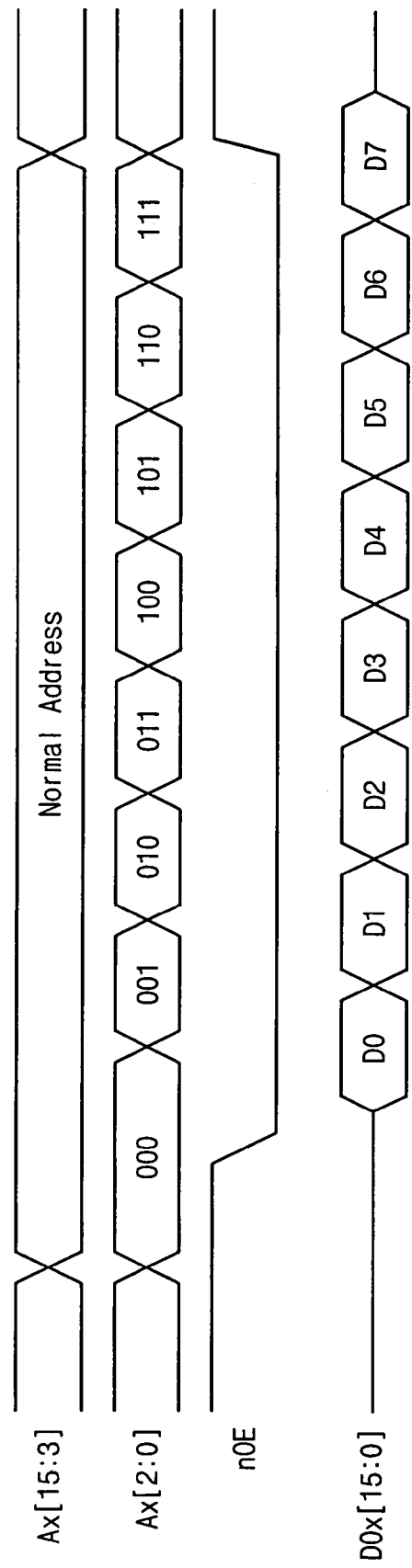
FIG. 1 is a waveform timing diagram illustrating a page mode operation of a conventional semiconductor memory device.
Figure 2:
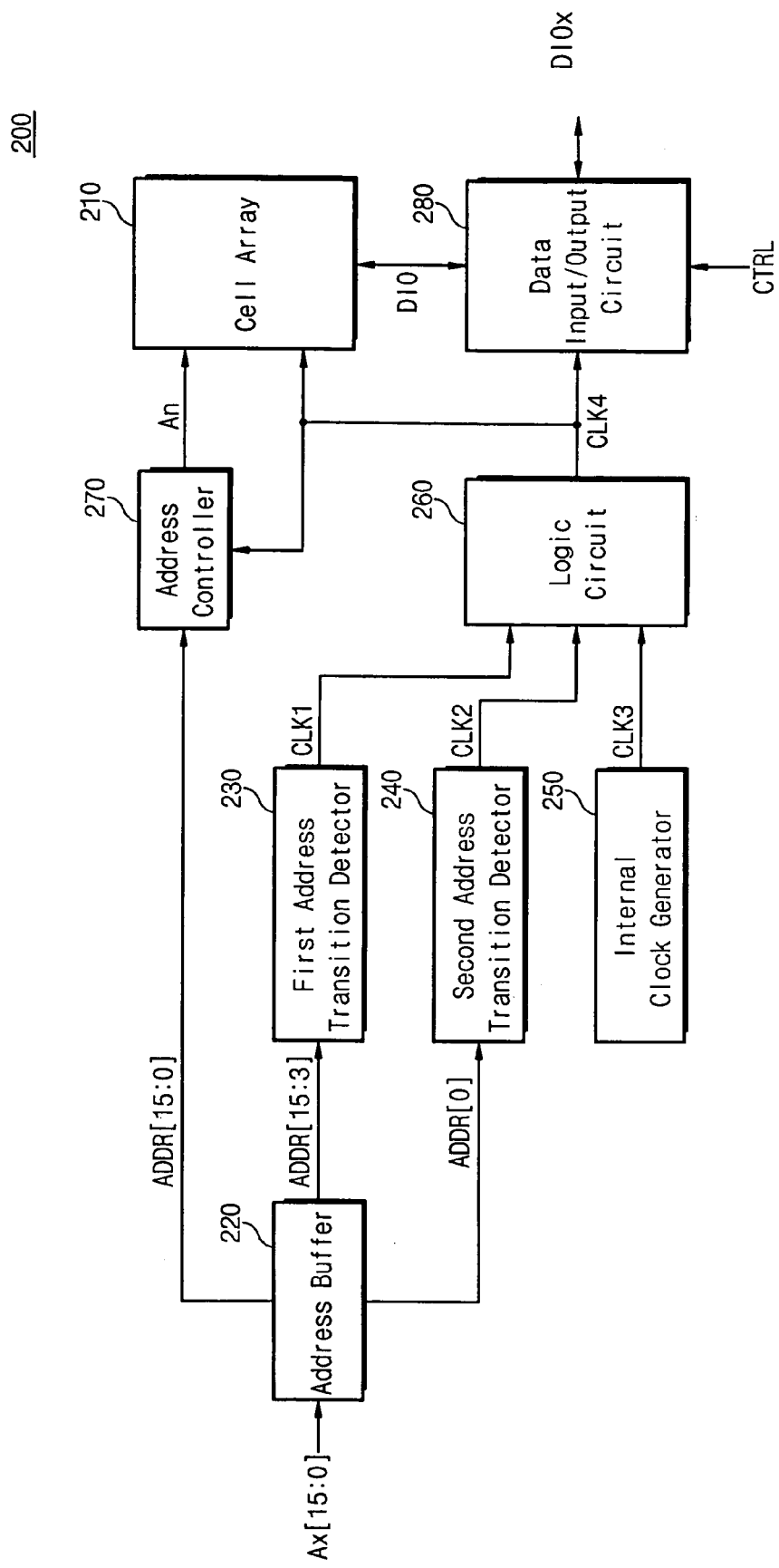
FIG. 2 is a block diagram of a semiconductor memory device according an embodiment of the present invention.

FIG. 2 is a block diagram of a semiconductor memory device according to an embodiment of the present invention.

Referring to FIG. 2, a semiconductor memory device 200 comprises a cell array 210, an address buffer 220, a first address transition detector 230, a second address transition detector 240, an internal clock generator 250, a logic circuit 260, an address controller 270, and a data input/output circuit 280.

Cell array 210 comprises a plurality of memory cells (not shown) for storing data. The memory cells are selected by an address An[15:0] output by address controller 270.

Address buffer 220 receives a start address Ax[15:0] from an external source and outputs an internal start address ADDR [15:0]. Internal start address ADDR[15:0] is used to select memory cells that are accessed in a page mode operation. Address buffer 220 also outputs two different parts of internal start address ADDR[15:0], including a first part ADDR[15: 3], and a second part ADDR[2:0]. First part ADDR[15:3] acts as a "first address", and second part ADDR[2:0] acts as a page address. Address buffer 220 outputs a lower bit (e.g., ADDR [0]) of the page address as a "second address". The first and second addresses do not necessarily have to be divided up as above. For example, the first address could alternatively be defined as ADDR[15:0] or ADDR[15:1] and the second address could be defined as ADDR[1] or ADDR[2].

In this written description, first address ADDR[15:3] is also referred to as "normal address" Ax[15:3], and second address ADDR[0] is also referred to as least significant bit (LSB) address Ax[0]. In addition, a portion ADDR[2:1] of internal start address is also referred to as address Ax[2:1].

First address transition detector 230 detects a transition of the first address and generates a first clock signal CLK1 in response to the transition of the first address. Second address transition detector 240 detects a transition of the second address and generates a second clock signal CLK2 in response to the transition of the second address. For example, first address transition detector 230 generates clock signal CLK1 as a pulse when semiconductor memory device 200 receives the start address, and second address transition detector 240 generates a clock signal CLK2 as a pulse when semiconductor memory device 200 receives the least significant bit (LSB) Ax[0] of the start address.

Internal clock generator 250 generates a third clock signal CLK3 after first clock signal CLK1 is generated and before second clock signal CLK2 is generated. Internal clock generator 250 generates third clock signal CLK3 with a predetermined number of pulses based on an initial access time combined with internal logic. For example, in FIG. 3, the predetermined number of pulses is two (2), and therefore internal clock generator 250 generates third clock signal CLK3 with two pulses. Third clock signal CLK3 is used to increment internal start address ADDR[15:0] before data is read from cell array 210. Although the term "increment" is used to describe changes in addresses throughout this written description, those skilled in the art will understand that wherever the term "increment" is used, various other ways of modifying an address (e.g., decrementing, or non-sequential modifications) are also possible.

Logic circuit 260 receives first through third clock signals CLK1 through CLK3 and generates a fourth clock signal CLK4. Fourth clock signal CLK4 is a combination of first through third clock signals CLK1 through CLK3 and acts as an internal clock signal for semiconductor memory device 200. Fourth clock signal CLK4 is applied to cell array 210, address controller 270, and data input/output circuit 280.

Address controller 270 receives internal start address ADDR[15:0] in synchronization with fourth clock signal CLK4 and sequentially increments start address ADDR[15: 0] by a predetermined page length (PL). For example, where page length PL is 8 words and the page address is three bits long, address controller 270 initializes an access address An[15:0] and then sequentially increments access address An[15:0] seven times in synchronization with fourth clock signal CLK4. This process successively generates access address as A0[15:0], A1[15:0], . . . , A7[15:0]. Typically, access address An[15:0] is initialized with internal start address ADDR[15:0]. Memory cells in cell array 210 are selected by access address An[15:0], and the memory cells are accessed in synchronization with fourth clock signal CLK4.

Data input/output circuit 280 is used to output data from semiconductor memory device 200 in a page mode read operation and it is used to input data to semiconductor memory device 200 in a page mode write operation. Data input/output circuit 280 is controlled by a control signal CTRL. Control signal CTRL is shown, for example, as an output enable signal nOE in FIG. 3 and a write enable signal nWE in FIG. 4. In a page mode read operation, control signal CTRL is activated (e.g., set to a logic level "high"), and data input/output circuit 280 reads data from memory cells in cell array 210 via an internal data input/output line DIO in synchronization with fourth clock signal CLK4. In a page mode write operation, control signal CTRL is activated, and data input/output circuit 280 stores data received through external input/output line DIOx in memory cells of cell array 210 via internal input/output line DIO in synchronization with fourth clock signal CLK4.

Figure 3:
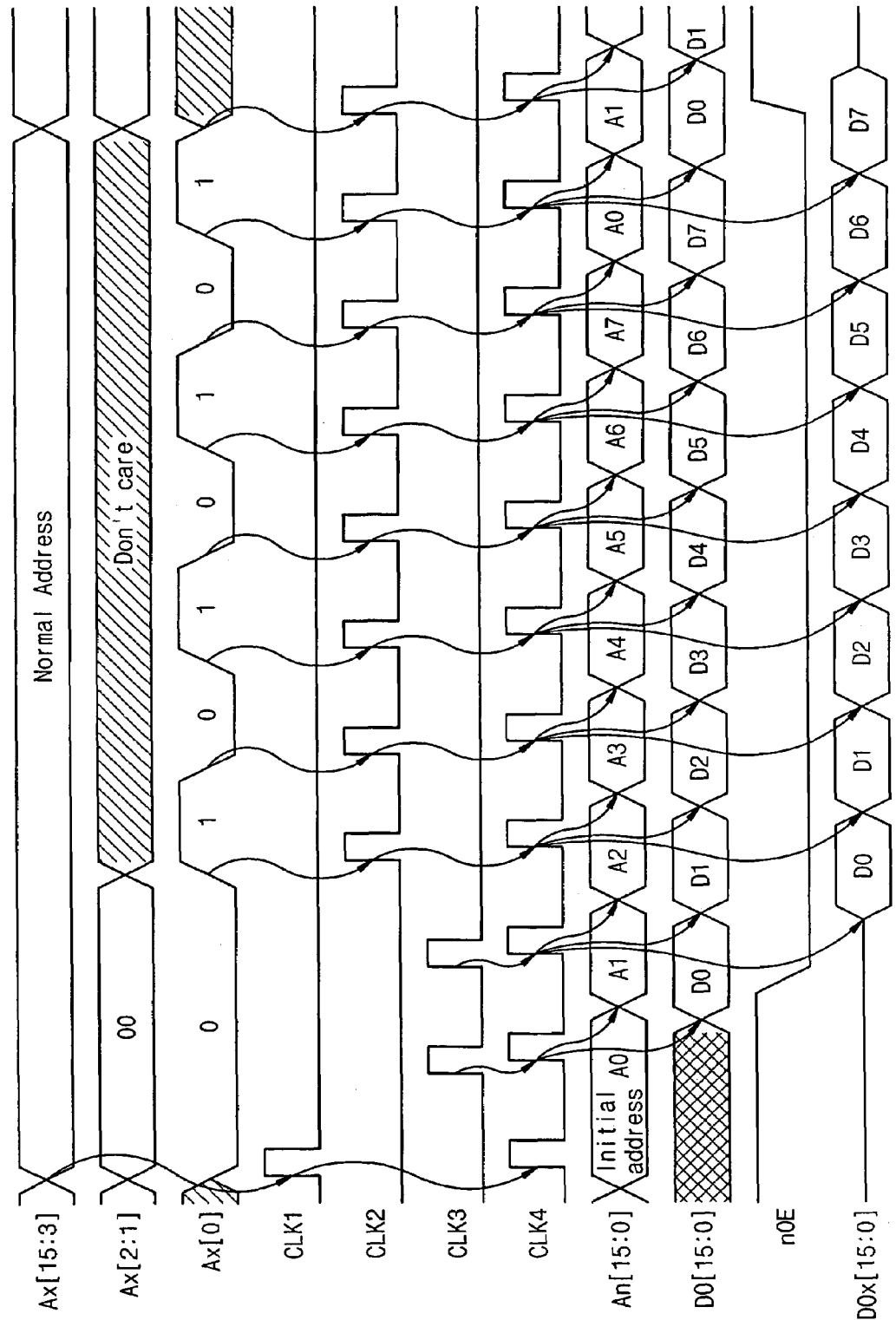
FIG. 3 is a waveform timing diagram illustrating a page mode read operation of a semiconductor memory device according to an embodiment the present invention.

FIG. 3 is a waveform timing diagram illustrating a page mode read operation of semiconductor memory device 200. The page mode read operation is described below in relation to both FIGS. 2 and 3.

Referring to FIG. 3, address buffer 220 receives start address Ax[15:0] and first address transition detector 230 detects a transition of normal address Ax[15:3]. Transition detector 230 then generates first clock signal CLK1. Internal clock generator 250 generates third clock signal CLK3 with a predetermined number of pulses. For example, where the predetermined number is 2, third clock signal CLK3 has a first pulse and a second pulse. After third clock signal CLK3 is generated, second address transition detector 240 generates second clock signal CLK2 in response to a transition of LSB address Ax[0]. Fourth clock signal CLK4 is used as an internal clock for semiconductor memory device 200. Fourth clock signal CLK4 is generated according to a combination of first through third clock signals CLK1, CLK2 and CLK3.

Internal start address ADDR[15:0] is applied to address controller 270 in synchronization with a first transition of fourth clock signal CLK4. At this time, address controller 270 generates access address A0[15:0]. The first transition of fourth clock signal CLK4 corresponds to a pulse of first clock signal CLK1.

Address controller 270 increments access address A0[15:0] to produce access address A1[15:0] in synchronization with a second transition of fourth clock signal CLK4. Data D0 stored in memory cells selected by address A0[15:0] is then transferred to data input/output circuit 280 in synchronization with a second transition of fourth clock signal CLK4.

Then, address controller 270 increments access address A1[15:0] to produce access address A2[15:0] in synchronization with a third transition of fourth clock signal CLK4. Data D1 stored in memory cells selected by address A1[15:0] is then transferred to data output circuit 280 in synchronization with a third transition of fourth clock signal CLK4. In addition, data input/output circuit 280 outputs data D0 via external input/output line DIOx in synchronization with the third transition of fourth clock signal CLK4. The second and third transitions of fourth clock signal CLK4 are generated by third clock signal CLK3.

Similarly, address controller 270 increments access address A2[15:0] to produce access address A3[15:0] in synchronization with a fourth transition of fourth clock signal CLK4. Data D2 stored in memory cells selected by address A2[15:0] is transferred to data output circuit 280 in synchronization with the fourth transition of fourth clock signal CLK4. In addition, data output circuit 280 outputs data D1 via external input/output line DIOx in synchronization with the fourth transition of fourth clock signal CLK4. The fourth transition of fourth clock signal CLK4 is generated by a transition of LSB address Ax[0].

As described above, whenever LSB address Ax[0] transitions, address controller 270 increments access address An[15:0], data stored in selected memory cells of cell array 210 is transferred to data output circuit 280, and data input/output circuit 280 outputs data via internal input/output line DIO. In other words, in a page mode read operation of semiconductor memory device 200, data is output from data input/output circuit 280 in a pipelined fashion in synchronization with transitions of LSB address Ax[15:0].

Figure 4:
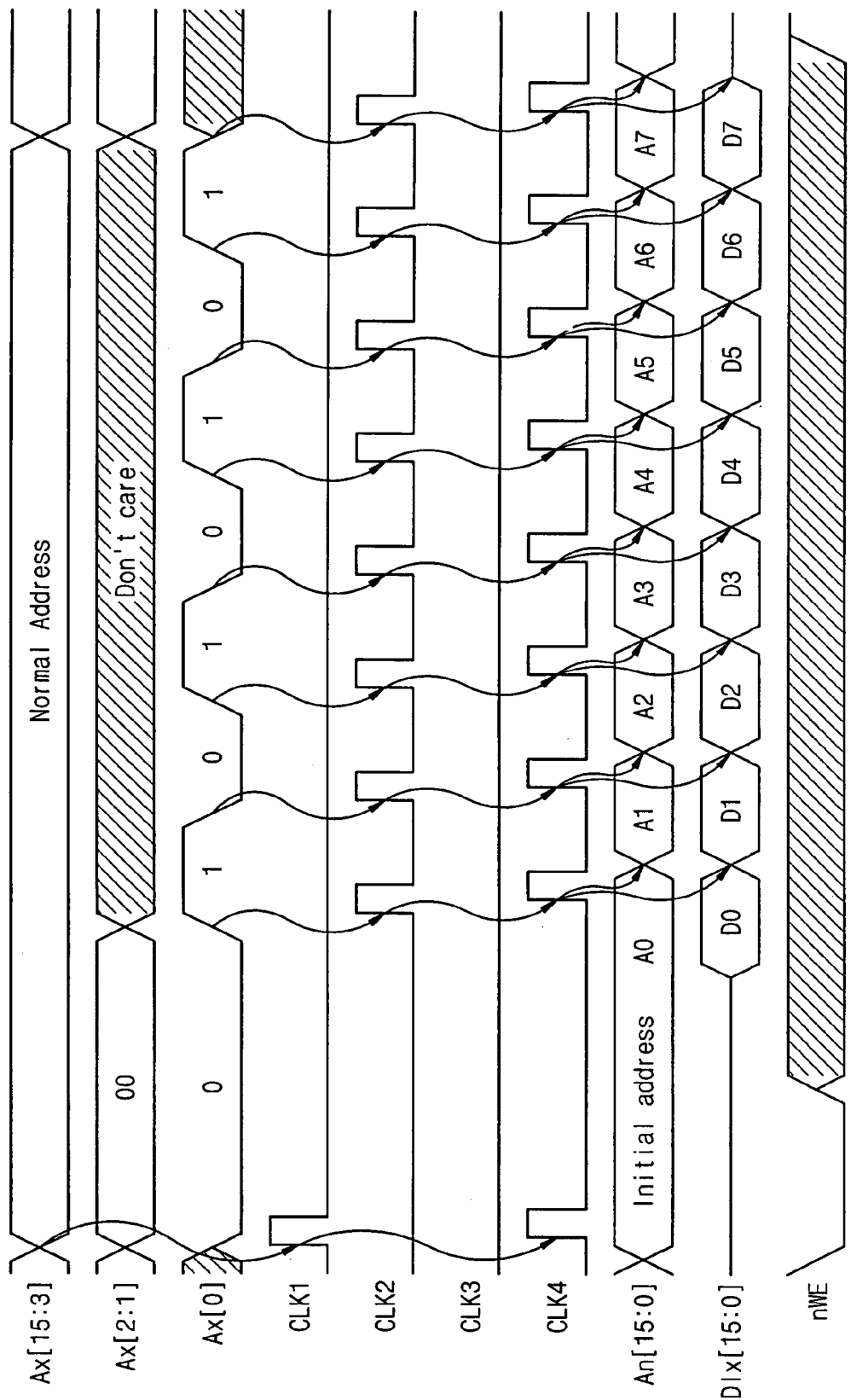
FIG. 4 is a waveform timing diagram illustrating a page mode write operation of a semiconductor memory device according to an embodiment of the present invention.

FIG. 4 is a waveform timing diagram illustrating a page mode write operation of semiconductor memory device 200. The page mode write operation is described in relation to FIGS. 2 and 4.

Referring to FIG. 4, the page mode write operation is similar to the above-described page mode read operation except that no third clock signal CLK3 is generated by internal clock generator 250 and data input/output circuit 280 is controlled by write enable signal nWE instead of output enable signal nOE. In the page mode write operation of semiconductor memory device 200, access address An[15:0] is sequentially incremented in synchronization with transitions of LSB address Ax[0] and data input/output circuit 280 receives data according to the incremented address.

In a page mode read or write operation, semiconductor memory device 200 receives a start address and sequentially inputs or outputs page data according to transitions of LSB address Ax[0]. Semiconductor memory device 200 achieves efficient data input/output speed by generating a predetermined number of pulses in an internal clock signal, incrementing the start address according to the internal clock signal, and transferring data from selected memory cells based on previous access addresses. Since semiconductor memory device 200 uses transitions of LSB address Ax[0] to generate pulses in the internal clock signal, it is possible to improve the performance of an asynchronous system including a semiconductor memory device using embodiments of the present invention.

As described above, in a page mode operation, semiconductor memory device 200 outputs or receives page data in response to transitions of an LSB address, obviating the need to input receive all page addresses.

The foregoing preferred embodiments are teaching examples. Those of ordinary skill in the art will understand that various changes in form and details may be made to the exemplary embodiments without departing from the scope of the present invention as defined by the following claims.

What is claimed:

1. A semiconductor memory device adapted to perform a page mode operation, the device comprising:
    a first address transition detector adapted to generate a first clock signal upon detecting transition of a first address;
    a second address transition detector adapted to generate a second clock signal upon detecting transition of a second address after the first clock signal is generated; and
    an address controller adapted to receive an internal start address and sequentially generate a plurality of access addresses by generating a current access address equal to the internal start address and then incrementing the current access address in response to at least the second clock signal;
    wherein the internal start address comprises the first address and the second address, and the second address is a lower bit of the internal start address, and
    wherein the address controller sequentially accesses memory cells selected by the plurality of access addresses in response to at least the second clock signal.

2. The semiconductor memory device of claim 1, wherein the lower bit is a least significant bit of a start address corresponding to the internal start address.

3. The semiconductor memory device of claim 1, wherein the page mode operation is a page mode read operation.

4. The semiconductor memory device of claim 3, further comprising:
    a data output circuit adapted to output data stored in the memory cells in response to at least the second clock signal.

5. The semiconductor memory device of claim 1, further comprising:
    a logic circuit receiving at least the first and second clock signals and providing a fourth clock signal to the address controller and the memory cell array,
    wherein the fourth clock signal is a combination of at least the first and second clock signals.

6. A semiconductor memory device adapted to perform a page mode operation, the device comprising:
    a first address transition detector adapted to generate a first clock signal upon detecting transition of a first address;
    a second address transition detector adapted to generate a second clock signal after detecting transition of a second address after the first clock signal is generated;
    an internal clock generator adapted to internally generate a third clock signal before the second clock signal is generated; and
    an address controller adapted to receive an internal start address and sequentially generate a plurality of access addresses by generating a current access address equal to the internal start address and then incrementing the current access address in response to at least the second and third clock signals;

wherein the internal start address comprises the first address and the second address, and the second address is a lower bit of the internal start address, and wherein the address controller sequentially accesses memory cells selected by the plurality of access addresses in response to at least the second and third clock signals.

7. The semiconductor memory device of claim 6, wherein the lower bit is the least significant bit of a start address corresponding to the internal start address.

8. The semiconductor memory device of claim 6, wherein the page mode operation is a page mode read operation.

9. The semiconductor memory device of claim 8, further comprising:

a data output circuit adapted to output data stored in the memory cells in response to at least the second and third clock signals.

10. The semiconductor memory device of claim 6, further comprising an internal crock generator internally generating a third clock signal.

11. The semiconductor memory device of claim 10, further comprising:

a logic circuit receiving the first, second, and third clock signals and providing a fourth clock signal to the address controller and the memory cell array, wherein the fourth clock signal is a combination of the first, second, and third clock signals.

12. A semiconductor memory device adapted to perform a page mode operation, the device comprising:

an address buffer receiving a start address and outputting an internal start address comprising a first address and a second address, wherein the second address is a lower bit of the internal start address;

a first address transition detector receiving the first address and generating a first clock signal upon detecting transition of the first address;

a second address transition detector receiving the second address and generating a second clock signal upon detecting transition of the second address after the first clock signal is generated; and an address controller sequentially providing access addresses to a memory cell array to sequentially access memory cells in the memory cell array, wherein the address controller receives the internal start address and generates the access addresses by generating a current access address equal to the internal start address and then incrementing the current access address in response to at least the second clock signal.

13. The semiconductor memory device of claim 12, further comprising an internal clock generator internally generating a third clock signal.

14. The semiconductor memory device of claim 13, further comprising:

a logic circuit receiving the first, second, and third clock signals and providing a fourth clock signal to the address controller and the memory cell array, wherein the fourth clock signal is a combination of the first, second, and third clock signals.

\* \* \* \* \*